(12) United States Patent
Pathak et al.

(10) Patent No.: US 12,142,893 B2
(45) Date of Patent: *Nov. 12, 2024

(54) THERMALLY-CONTROLLED PHOTONIC STRUCTURE

(71) Applicant: Lumentum Operations LLC, San Jose, CA (US)

(72) Inventors: Shibnath Pathak, San Jose, CA (US); Duanhua Kong, Milpitas, CA (US); Michael C. Larson, Oakland, CA (US); Amit Mizrahi, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/054,989

(22) Filed: Nov. 14, 2022

(65) Prior Publication Data

US 2023/0073927 A1 Mar. 9, 2023

Related U.S. Application Data

(63) Continuation of application No. 17/032,787, filed on Sep. 25, 2020, now Pat. No. 11,502,480.

(60) Provisional application No. 63/017,380, filed on Apr. 29, 2020.

(51) Int. Cl.
| | |
|---|---|
| *H01S 3/04* | (2006.01) |
| *H01S 5/024* | (2006.01) |
| *H01S 5/06* | (2006.01) |
| *H01S 5/068* | (2006.01) |
| *H01S 5/22* | (2006.01) |

(52) U.S. Cl.
CPC ........ *H01S 5/02453* (2013.01); *H01S 5/0612* (2013.01); *H01S 5/068* (2013.01); *H01S 5/22* (2013.01); *H01S 5/02461* (2013.01)

(58) Field of Classification Search
CPC .... H01S 5/02453; H01S 5/0612; H01S 5/068; H01S 5/22; H01S 5/02461
See application file for complete search history.

(56) References Cited

U.S. PATENT DOCUMENTS

| | | | |
|---|---|---|---|
| 8,861,556 B2 | 10/2014 | Larson | |
| 11,502,480 B2* | 11/2022 | Pathak | .................. H01S 5/068 |
| 2006/0198416 A1* | 9/2006 | Yamazaki | ............. H01S 5/1032 |
| | | | 372/67 |
| 2014/0010248 A1* | 1/2014 | Larson | ............... H01S 5/02461 |
| | | | 372/20 |

(Continued)

*Primary Examiner* — Kinam Park
(74) *Attorney, Agent, or Firm* — Harrity & Harrity, LLP (57) ABSTRACT

In some implementations, a thermally-controlled photonic structure may include a suspended region that is suspended over a substrate; a plurality of bridge elements connected to the suspended region and configured to suspend the suspended region over the substrate, where a plurality of openings are defined between the plurality of bridge elements; and at least one heater element having a modulated width disposed on the suspended region. The at least one heater element having the modulated width may include at least one section of a greater width and at least one section of a lesser width. The at least one section of the greater width may be in alignment with an opening of the plurality of openings and the at least one section of the lesser width may be in alignment with a bridge element of the plurality of bridge elements.

20 Claims, 5 Drawing Sheets

(56) References Cited

U.S. PATENT DOCUMENTS

2014/0321488 A1* 10/2014 Chen .................. H01S 5/02461
                                                                438/694
2016/0291352 A1* 10/2016 Kissa .................... G02F 1/0316
2017/0194764 A1*  7/2017 Evans ................... G02F 1/2255
2020/0076155 A1*  3/2020 Wu ..................... H01S 5/06256

* cited by examiner

THERMALLY-CONTROLLED PHOTONIC STRUCTURE

CROSS-REFERENCE TO RELATED APPLICATION

This patent application is a continuation of U.S. patent application Ser. No. 17/032,787, filed Sep. 25, 2020 (now U.S. Pat. No. 11,502,480), which claims priority to U.S. Provisional Patent Application No. 63/017,380, filed on Apr. 29, 2020, and entitled "UNIFORM THERMAL TUNING OF PHOTONIC STRUCTURES," the contents of which are incorporated herein by reference in their entireties.

TECHNICAL FIELD

The present disclosure relates to tunable lasers and to thermal control of tunable lasers that use a suspended mirror.

BACKGROUND

A tunable laser is a laser for which a wavelength of operation can be altered in a controlled manner. A tunable laser may be used in an optical communications system, a telecommunication system, and/or the like, such as in a transceiver, a line card, and/or the like. A tunable laser may include a mirror that is made wavelength selective, and a reflection wavelength of the mirror is tuned. In some cases, a waveguide grating may be used as a wavelength selective mirror in a tunable laser. In a waveguide grating, periodic perturbations of the effective refractive index of the waveguide are created to selectively reflect light at a wavelength corresponding to the spatial frequency of the periodic refractive index perturbations. A waveguide grating can be tuned by thermal tuning (e.g., heating). Thermal tuning uses considerable amounts of heat applied to the waveguide grating to change the temperature of the waveguide grating.

SUMMARY

In some implementations, a thermally-controlled mirror structure includes an optical waveguide region suspended over a substrate, where the optical waveguide region includes a grating for reflecting light; a plurality of bridge elements connected to the optical waveguide region and configured to suspend the optical waveguide region over the substrate, where a plurality of openings are defined between the plurality of bridge elements; and at least one heater element having a modulated width disposed on the optical waveguide region, where the at least one heater element having the modulated width includes at least one section of a greater width and at least one section of a lesser width, and where the at least one section of the greater width is in alignment with an opening of the plurality of openings and the at least one section of the lesser width is in alignment with a bridge element of the plurality of bridge elements.

In some implementations, a thermally-controlled photonic structure includes a suspended region that is suspended over a substrate; a plurality of bridge elements connected to the suspended region and configured to suspend the suspended region over the substrate, where a plurality of openings are defined between the plurality of bridge elements; and at least one heater element having a modulated width disposed on the suspended region, where the at least one heater element having the modulated width includes at least one section of a greater width and at least one section of a lesser width, and where the at least one section of the greater width is in alignment with an opening of the plurality of openings and the at least one section of the lesser width is in alignment with a bridge element of the plurality of bridge elements.

In some implementations, a tunable laser includes a thermally-controlled mirror structure, including: an optical waveguide region suspended over a substrate, where the optical waveguide region includes a grating for reflecting light; a plurality of bridge elements connected to the optical waveguide region and configured to suspend the optical waveguide region over the substrate, where a plurality of openings are defined between the plurality of bridge elements; and at least one heater element having a modulated width disposed on the optical waveguide region, where the at least one heater element having the modulated width includes at least one section of a greater width and at least one section of a lesser width, and where the at least one section of the greater width is in alignment with an opening of the plurality of openings and the at least one section of the lesser width is in alignment with a bridge element of the plurality of bridge elements.

DETAILED DESCRIPTION

The following detailed description of example implementations refers to the accompanying drawings. The same reference numbers in different drawings may identify the same or similar elements.

As described above, a tunable laser may employ a mirror that is tuned by heating. For example, a resistor (e.g., a resistive heater) may be located on or near a waveguide, and the resistor may heat a laser cavity mirror (e.g., a grating) associated with the waveguide. The resistor may have a uniform width. The refractive index of the mirror may be locally changed by heating according to a thermo-optic effect. This may shift mirror peaks, and thus tune a wavelength of the tunable laser.

In some cases, a tunable laser may include a suspended structure. For example, the mirror of the tunable laser may be suspended over a substrate by a set of bridges. This provides thermal isolation, increases thermal impedance, and reduces thermal mass. As a result, the tunable laser may achieve higher tuning efficiency and consume less power. The set of bridges may be thermally conductive, and therefore may provide pathways for heat to escape the suspended structure. Thus, a temperature of the suspended structure may be lower near the bridges. This may affect a uniformity of the heating of the mirror, particularly if a continuous grating is used, and may cause laser tuning distortion.

Some implementations described herein provide thermally-controlled (e.g., thermally-tuned) photonic structures. The photonic structure may include a suspended region, such as a suspended mirror of a tunable laser, that is suspended by a set of bridges. In some implementations, the photonic structure may include a heater having a modulated width that is used to heat the suspended structure. The modulated width of the heater provides modulation of the resistance of the heater, thereby resulting in one or more sections of the heater with relatively more heat generation and one or more sections of the heater with relatively less heat generation. Thus, modulation of the heater's local resistance can compensate for heat loss through the set of bridges, thereby flattening a temperature curve associated with the suspended region. In some implementations, the set of bridges may be staggered in order to further mitigate the effect of heat loss through the set of bridges. In this way, the thermally-controlled photonic structures described herein may have improved temperature uniformity, thereby improving optical performance, compactness, and reliability of a tunable laser.

Figure 1:
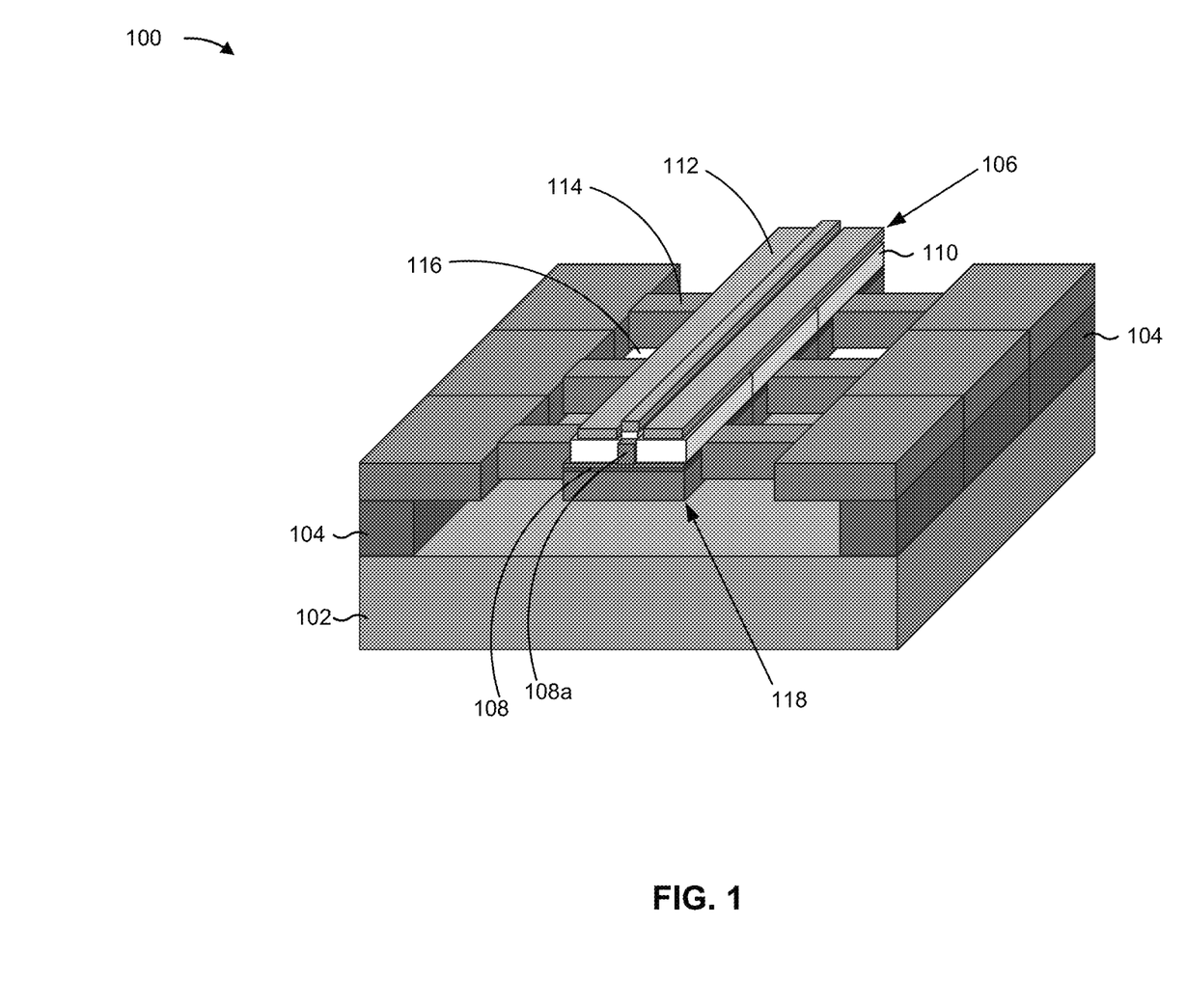
FIG. 1 is a perspective view of an example photonic structure described herein.

FIG. 1 is a diagram of a perspective view of an example photonic structure 100 described herein. The photonic structure 100 may be a thermally-tunable photonic structure. For example, the photonic structure 100 may be used in a tunable laser. However, the photonic structure 100 is not limited for use in a tunable laser, and may be used in other types of lasers, other optical systems that do not use a laser, other systems that use a thermally-tuned mirror, and/or the like.

As shown in FIG. 1, the photonic structure 100 may include a substrate 102. The substrate 102 may include a semiconductor material. For example, the semiconductor material may be indium phosphide (InP). The photonic structure 100 may include a spacer/sacrificial layer 104. The spacer/sacrificial layer 104 may include indium gallium arsenide (InGaAs). The spacer/sacrificial layer 104 may include support elements that project from a surface of the substrate 102 to form a gap between the substrate 102 and a suspended region 106 (e.g., a mesa structure).

The suspended region 106 may include an optical waveguide region 118 that includes an optical waveguide 108. As shown, the optical waveguide 108 may be a ridge waveguide. A ridge waveguide may include a stack of: a bottom cladding layer (e.g., supported by the spacer/sacrificial layer 104), a core layer disposed on the bottom cladding layer, and a top cladding layer disposed on the core layer. The top cladding layer may include a waveguide ridge 108a on top for guiding a light mode. The optical waveguide 108 may include a semiconductor material, such as InP.

The refractive index of the optical waveguide 108 may be modulated for reflecting light. For example, the optical waveguide 108 may include a grating (not shown), such as a Bragg grating. The grating may be thermally tunable. The grating may be a continuous grating or a sampled grating (e.g., a grating with one or more burst sections). In some implementations, the grating may be etched in a surface of the waveguide ridge 108a.

The suspended region 106 may include an insulating dielectric layer 110 that is positioned above the optical waveguide 108 (e.g., deposited on the top cladding layer). The suspended region 106 may include at least one heater element 112. For example, the heater element 112 may be positioned above (e.g., deposited on) the dielectric layer 110. The heater element 112 may be a resistive heater. That is, the heater element 112 may be a resister that generates heat when a current is applied. The heater element 112 may be a thin-film electrode. The heater element 112 may include a metal or a metal alloy, such as tantalum nitride (TaN).

The suspended region 106 may be suspended over the substrate 102 by a plurality of bridge elements 114. The bridge elements 114 may be thermal contacts that extend laterally from the suspended region 106 (e.g., according to a regular or an irregular spacing pattern). For example, first and second sets of bridge elements 114 may run along opposite sides of the suspended region 106 (e.g., relative to a line defined by the waveguide ridge 108a). The bridge elements 114 may define a plurality of openings 116 (e.g., first and second sets of openings 116 that run along opposite sides of the suspended region 106). For example, an opening 116 may be defined between two adjacent bridge elements 114, between a bridge element 114 and an edge of the suspended region 106, and/or the like. An opening 116 may extend from a top surface of the photonic structure 100 to the gap between the substrate 102 and suspended region 106. In some implementations, the suspended region 106 (e.g., an optical waveguide region 118) may be etched to form the bridge elements 114 and openings 116. The bridge elements 114 may connect the suspended region 106 to the substrate 102 (e.g., via a field region and/or the spacer/sacrificial layer 104). In some implementations, locations of the bridge elements 114 may align with locations of burst sections of a sampled grating.

As indicated above, FIG. 1 is provided as an example. Other examples may differ from what is described with regard to FIG. 1. The quantity and arrangement of layers shown in FIG. 1 are provided as an example. In practice, the suspended structure 100 may include additional layers, fewer layers, different layers, or differently arranged layers than those shown in FIG. 1. Additionally, or alternatively, a set of layers (e.g., one or more layers) of the suspended structure 100 may perform one or more functions described as being performed by another set of layers of the suspended structure 100.

Figure 2:
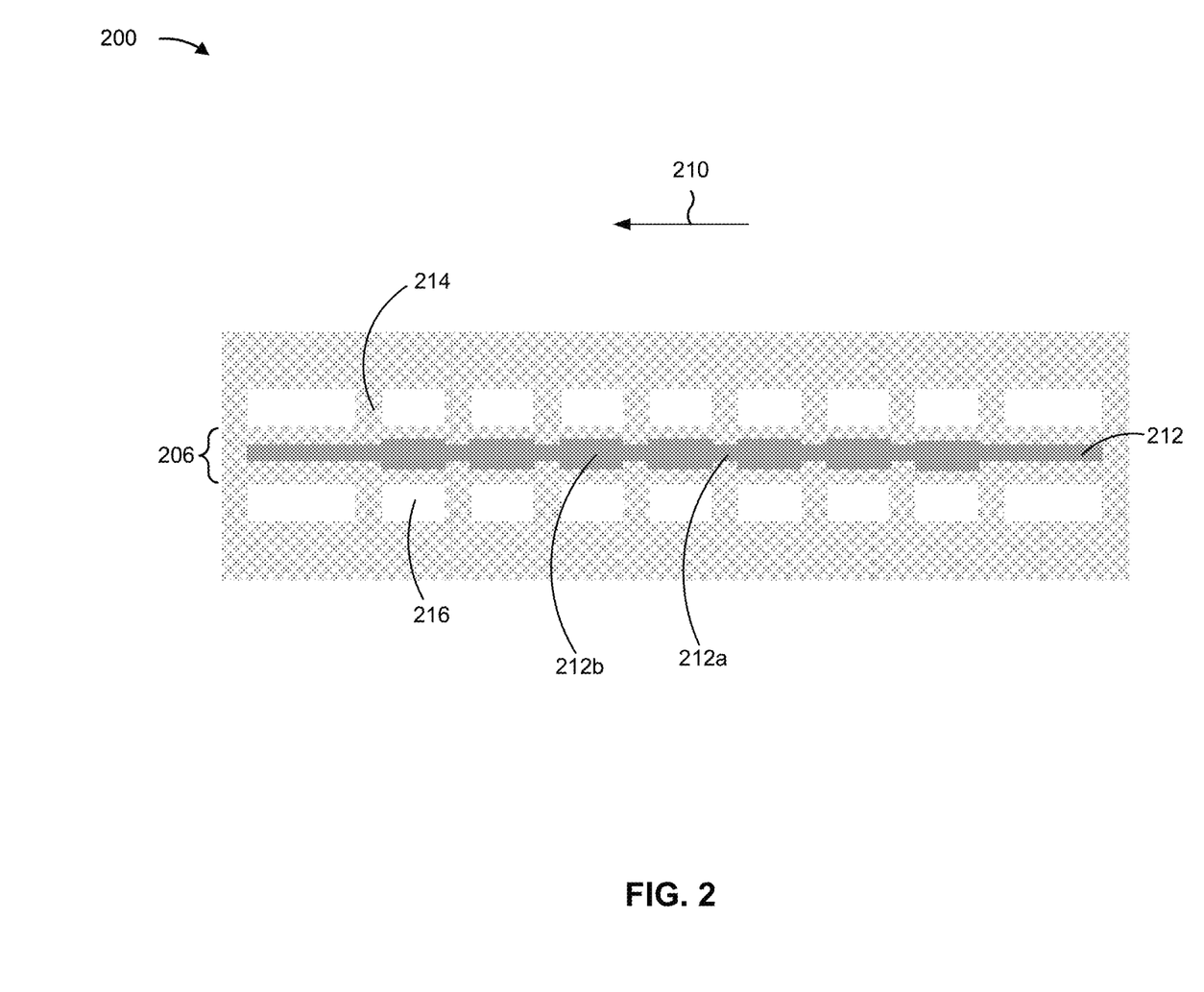
FIG. 2 is an overhead view of an example photonic structure described herein.

FIG. 2 is an overhead view of an example photonic structure 200 described herein. The photonic structure 200 may correspond to, or may be included in, the photonic structure 100. The photonic structure 200 may be thermally uniform, or otherwise thermally controlled.

The photonic structure 200 may include a suspended region 206, as described above. For example, the suspended region 206 may include an optical waveguide region that includes an optical waveguide and a mirror (e.g., the optical waveguide may include a grating). The suspended region 206 may include a heater element 212, as described above. For example, the heater element 212 may be a resistive heater (e.g., a resistor). The heater element 212 may extend along the suspended region 206, generally in a direction of light propagation 210. For example, the heater element 212 may run parallel to the optical waveguide.

The suspended region 206 may be suspended over a substrate by a plurality of bridge elements 214, and the plurality of bridge elements 214 may define a plurality of openings 216, as described above. As described above, a first set of the bridge elements 214 may extend from a first side of the suspended region 206, and a second set of the bridge elements 214 may extend from a second (e.g., opposite) side of the suspended region 206. In some implementations, the first set of bridge elements 214 and the second set of bridge elements 214 may be aligned. For example, bridge elements of the first set of bridge elements 214 and the second set of bridge elements 214 may have corresponding lengths and corresponding locations along opposite sides of the suspended region 206. Thus, a first set of the openings 216 and a second set of the openings 216 on opposite sides of the suspended region 206 may have corresponding lengths and corresponding locations.

The heater element 212 may have a modulated width to provide a modulated resistance along the heater element 212. As shown in FIG. 2, the heater element 212 may include a generally longitudinal (e.g., in the direction of the light propagation 210) strip. The heater element 212 may include one or more sections of a lesser width (referred to herein as narrower sections) 212a and one or more sections of a greater width (referred to herein as wider sections) 212b. Accordingly, the narrower sections 212a may have a relatively higher resistance, thereby generating more heat, and the wider sections 212b may have a relatively lower resistance, thereby generating less heat, when a current is applied to the heater element 212.

The narrower sections 212a may be in alignment with the bridge elements 214, and the wider sections 212b may be in alignment with the openings 216. That is, the width of the heater element 212 may be modulated such that the narrower sections 212a are located along the heater element 212 so as to correspond to the locations of the bridge elements 214. Similarly, the wider sections 212b are located along the heater element 212 so that the locations of the wider sections 212b correspond to the locations of the openings 216. In this way, the heater element 212 has an increased local resistance in sections of the heater element 212 that align with the bridge elements 214, thereby generating more heat at the bridge elements 214 to compensate for the heat loss through the bridge elements 214.

In some implementations, the heater element 212 may have spatially rectangular modulation (as shown in FIG. 2), triangular modulation, and/or sinusoidal modulation, among other examples. In the case of rectangular modulation, or another similar modulation, a wider section may include a span of the heater element 212 of greater width (relative to adjacent spans of the heater element 212), and a narrower section may include a span of the heater element 212 of lesser width (relative to adjacent spans of the heater element 212). Here, the span of greater width may align with an opening 216 (e.g., a center of the span of greater width may align with a center of the opening 216), and the span of lesser width may align with a bridge element 214 (e.g., a center of the span of lesser width may align with a center of the bridge element 214). In the case of triangular modulation, sinusoidal modulation, or another similar modulation, a wider section may include a point of maximum width of the heater element 212 (or a point of greater width relative to adjacent sections of the heater element 212, such as at a crest of the modulation), and a narrower section may include a point of minimum width of the heater element 212 (or a point of lesser width relative to adjacent sections of the heater element 212, such as at a trough of the modulation). Here, the point of maximum width may align with an opening 216 (e.g., align with a center of the opening 216), and the point of minimum width may align with a bridge element 214 (e.g., align with a center of the bridge element 214).

The heater element 212 may include a first lateral side and a second lateral side. In some implementations, the first lateral side may be straight and the second lateral side may be modulated. That is, the first lateral side may be unmodulated and the second lateral side may be modulated (as described below in connection with FIG. 3). In some implementations, the first lateral side and the second lateral side may be modulated (as shown in FIG. 2).

Figure 3:
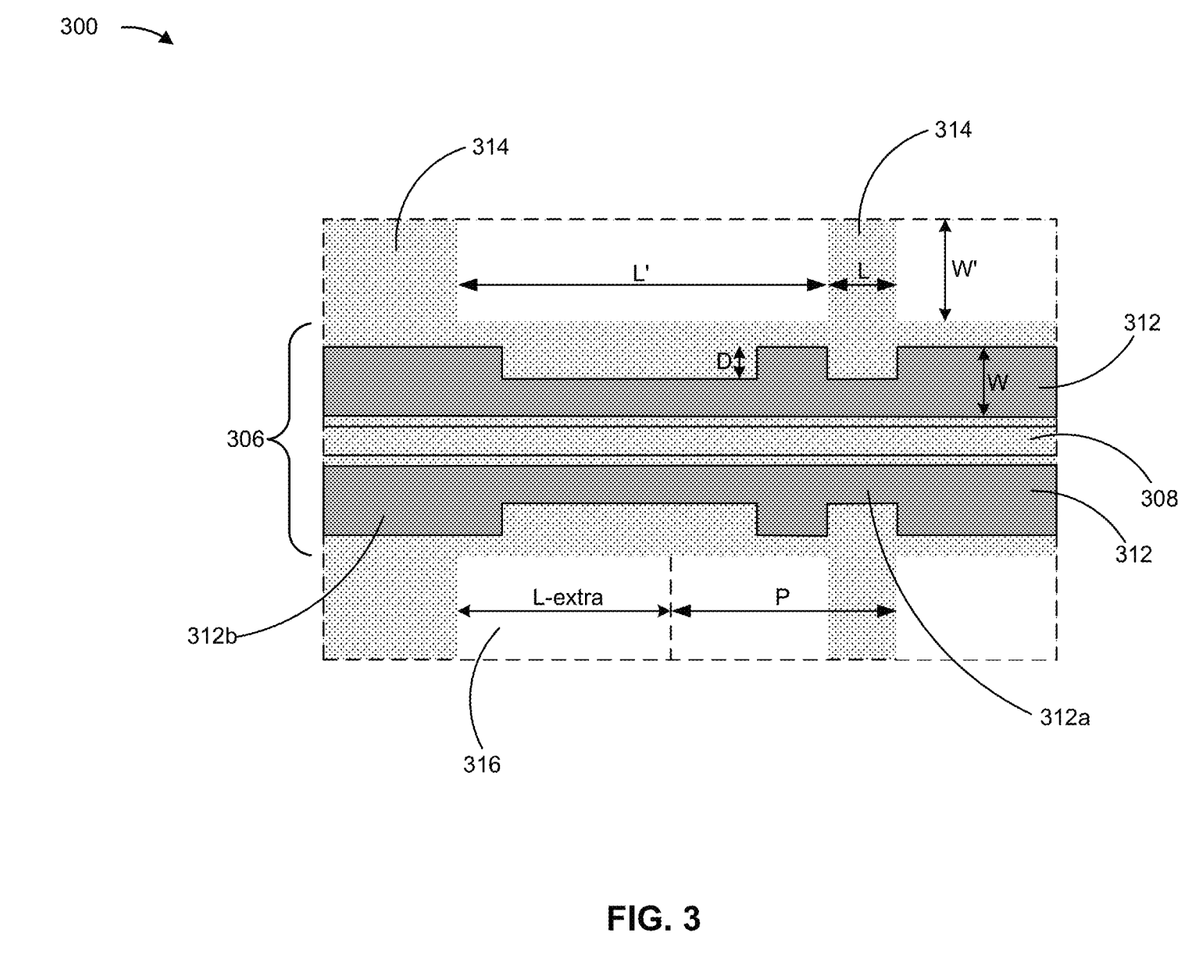
FIG. 3 is an overhead view of an example photonic structure described herein.

In some implementations, the heater element 212 may be positioned above the optical waveguide. For example, the heater element 212 may be positioned above a waveguide ridge of the optical waveguide. In some implementations, the heater element 212 may be positioned at a side of the optical waveguide. For example, the heater element 212 may be positioned at a side of a waveguide ridge of the optical waveguide. In some implementations, a first heater element 212 and a second heater element 212, at least one of which has a modulated width, may be positioned at opposite sides of the optical waveguide. For example, the first heater element 212 and the second heater element 212 may be positioned at opposite sides of a waveguide ridge of the optical waveguide (as shown in FIG. 3). The position of the heater element(s) 212 may be any combination of the foregoing.

As indicated above, FIG. 2 is provided as an example. Other examples may differ from what is described with regard to FIG. 2.

FIG. 3 is an overhead view of an example photonic structure 300 described herein. In particular, FIG. 3 shows an enlarged edge section of the photonic structure 300. The photonic structure 300 may correspond to, or may be included in, the photonic structure(s) 100 and/or 200. As shown in FIG. 3, the photonic structure 300 may include a suspended region 306, an optical waveguide 308, multiple heater elements 312 (or a single heater element, as described above), a plurality of bridge elements 314, and a plurality of openings 316, as described above. As shown in FIG. 3, a heater element 312 may include one modulated side and one unmodulated side. Moreover, a heater element 312 may include one or more narrower sections 312a and one or more wider sections 312b, as described above.

The edge section of the photonic structure 300 may include, from an edge of the photonic structure 300, a first opening 316 (or a last opening 316) and corresponding bridge element(s) 314. Accordingly, a middle section of the photonic structure 300 may include a portion of the photonic structure 300 between edge sections (e.g., between a first opening 316 and a last opening 316).

As shown in FIG. 3, a heater element 312 may have a width W and a modulation depth D. The width W of the heater element 312 may correspond to a width of the wider sections 312b, and a difference between the width W and the modulation depth D may correspond to the width of the narrower sections 312a. The modulation depth D may be a value that produces a resistance and a corresponding heat output that compensates for the heat loss associated with a bridge element 314. In some implementations, a heater element may employ multiple different modulation depths to provide a particular thermal tuning.

The bridge elements 314 and the openings 316 may each have a width W'. The bridge elements 314 may each have a length L. The openings 316 may each have a length L'. In some implementations, the length L may be less than the length L'. As described above, the bridge elements 314 may be located along the suspended region 306. For example, the bridge elements 314 may be located according to a spacing P, which corresponds to a distance that separates trailing edges of adjacent bridge elements 314.

In some implementations, an opening 316 at an edge section of the photonic structure 300 is sized differently than an opening 316 at the middle section of the photonic structure 300. For example, the opening 316 at the edge section may have a greater length than the opening 316 at the middle section. In other words, a bridge element 314 (e.g., defining the first opening 316 at the edge section) may be located according to the spacing P plus an additional distance L-extra. In this way, temperature uniformity at edge sections of the photonic structure 300 may be improved. In some implementations, a narrower section 312a at the edge section is sized differently than a narrower section 312a at the middle section. For example, the narrower section 312a at the edge section may have a greater length than the narrower section 312a at the middle section. The opening 316 at the edge section may be in alignment (or partial alignment) with the narrower section 312a at the edge section (e.g., the length of the narrower section 312a at the edge section may correspond to, or may be less than, the length of the opening 316 at the edge section).

As indicated above, FIG. 3 is provided as an example. Other examples may differ from what is described with regard to FIG. 3.

Figure 4:
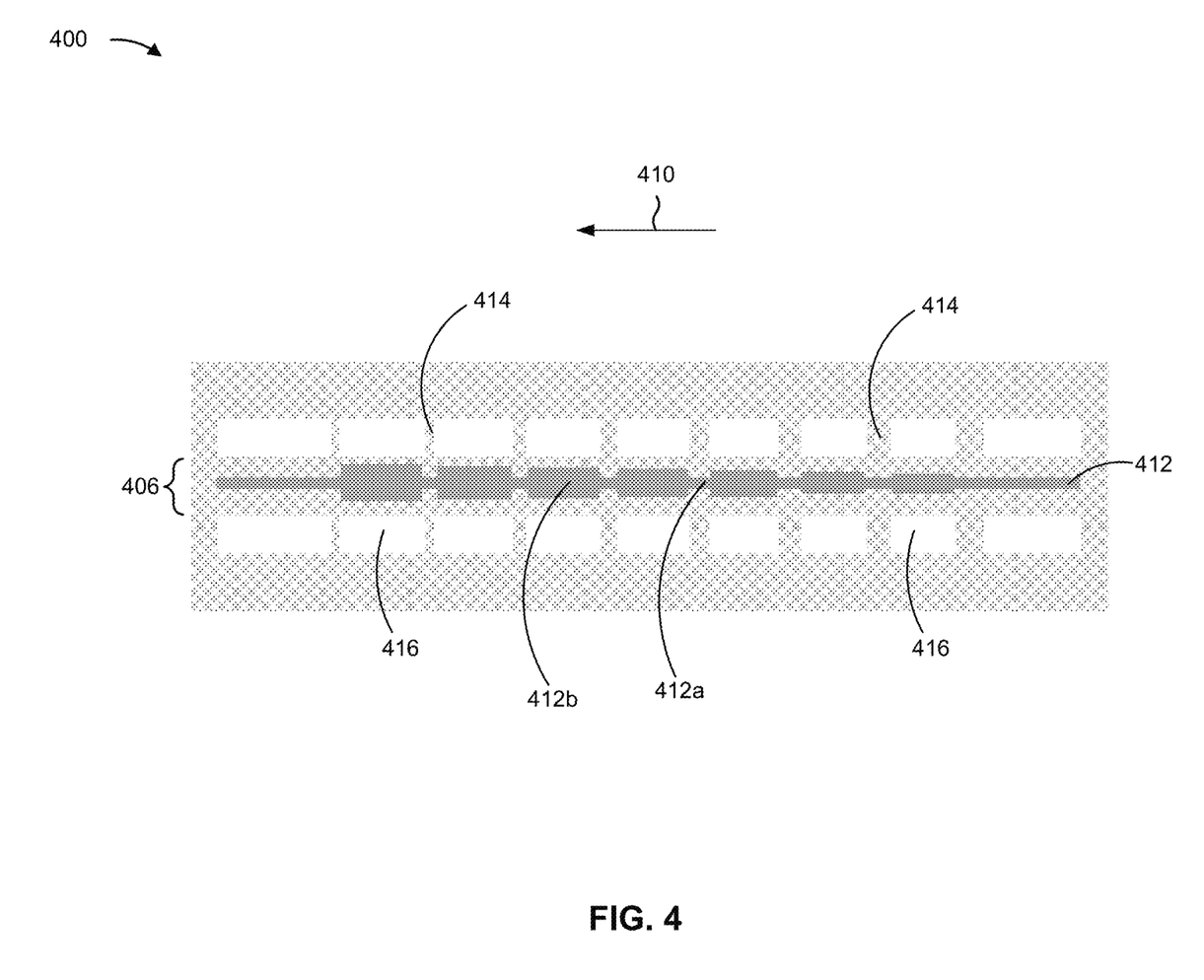
FIG. 4 is an overhead view of an example photonic structure described herein.

FIG. 4 is an overhead view of an example photonic structure 400 described herein. The photonic structure 400 may correspond to, or may be included in, the photonic structure(s) 100, 200, and/or 300. The photonic structure 400 may be thermally uniform, or otherwise thermally controlled. As shown in FIG. 4, the photonic structure 400 may include a suspended region 406 (e.g., including an optical waveguide), a heater element 412, a plurality of bridge elements 414, and a plurality of openings 416, as described above. For example, the heater element 412 may include one or more narrower sections 412a and one or more wider sections 412b, as described above.

In some implementations, the bridge elements 414 may have non-uniform lengths and/or the openings 416 may have non-uniform lengths. In some implementations, the narrower sections 412a may have non-uniform widths and/or the wider sections 412b may have non-uniform widths.

In some implementations, lengths of at least a portion of a set of bridge elements 414 (e.g., bridge elements 414 between a first and a last bridge element 414 of the set) along a lateral side of the suspended region 406 may change (e.g., decrease) along a length of the suspended region 406 or a portion thereof. For example, lengths of the bridge elements 414 may decrease in a direction of light propagation 410, such that a first bridge element 414 (e.g., nearer to a light source) has a first length (e.g., a greater length) and a second bridge element 414 (e.g., further from the light source) has a second length (e.g., a lesser length). Similarly, lengths of at least a portion of a set of openings 416 (e.g., openings 416 between a first and a last opening 416 of the set) along a lateral side of the suspended region 406 may change (e.g., increase) along a length of the suspended region 406 or a portion thereof. For example, lengths of the openings 416 may increase in the direction of light propagation 410, such that a first opening 416 (e.g., nearer to the light source) has a first length (e.g., a lesser length) and a second opening 416 (e.g., further from the light source) has a second length (e.g., a greater length).

In some implementations, widths of at least a portion of the wider sections 412b may change (e.g., increase) along a length of the suspended region 406 or a portion thereof. For example, widths of the wider sections 412b may increase in the direction of light propagation 410, such that a first wider section 412b (e.g., nearer to the light source) has a first width (e.g., a lesser width) and a second wider section 412b (e.g., further from the light source) has a second width (e.g., a greater width). In other words, a modulation depth for the heater element 412 may increase along a length of the heater element 412 or a portion thereof (e.g., the modulated width of the heater element 412 may be tapered). In some implementations, the lengths of the bridge elements 414 and the widths of the wider sections 412b may both change, as described above.

In some implementations, the bridge elements 414 may have non-uniform widths and/or the openings 416 may have non-uniform widths. That is, widths of the bridge elements 414 and/or openings 416 may change (e.g., increase or decrease) in the direction of light propagation, in a manner similar to that described above.

In this way, a thermal tuning efficiency of the photonic structure 400 may change (e.g., increase) in the direction of light propagation 410 (e.g., to compensate for a non-uniform temperature profile resulting from a self-heating effect caused by a light source incident on a mirror of an optical waveguide). For example, a first section of the photonic structure 400 may have a relatively lower thermal tuning efficiency, and a second section of the photonic structure 400 may have a relatively higher thermal tuning efficiency. The first section may be nearer to the light source and the second section may be further from the light source. Lower thermal tuning efficiency may result from relatively longer bridge elements 414 and/or relatively smaller modulation depths, as described above. Higher thermal tuning efficiency may result from relatively shorter bridge elements 414 and/or relatively larger modulation depths, as described above. Accordingly, the first section (lower thermal tuning efficiency) may permit higher heat loss, relative to the second section, to offset self-heating (which may be higher nearer to the light source).

As indicated above, FIG. 4 is provided as an example. Other examples may differ from what is described with regard to FIG. 4.

Figure 5:
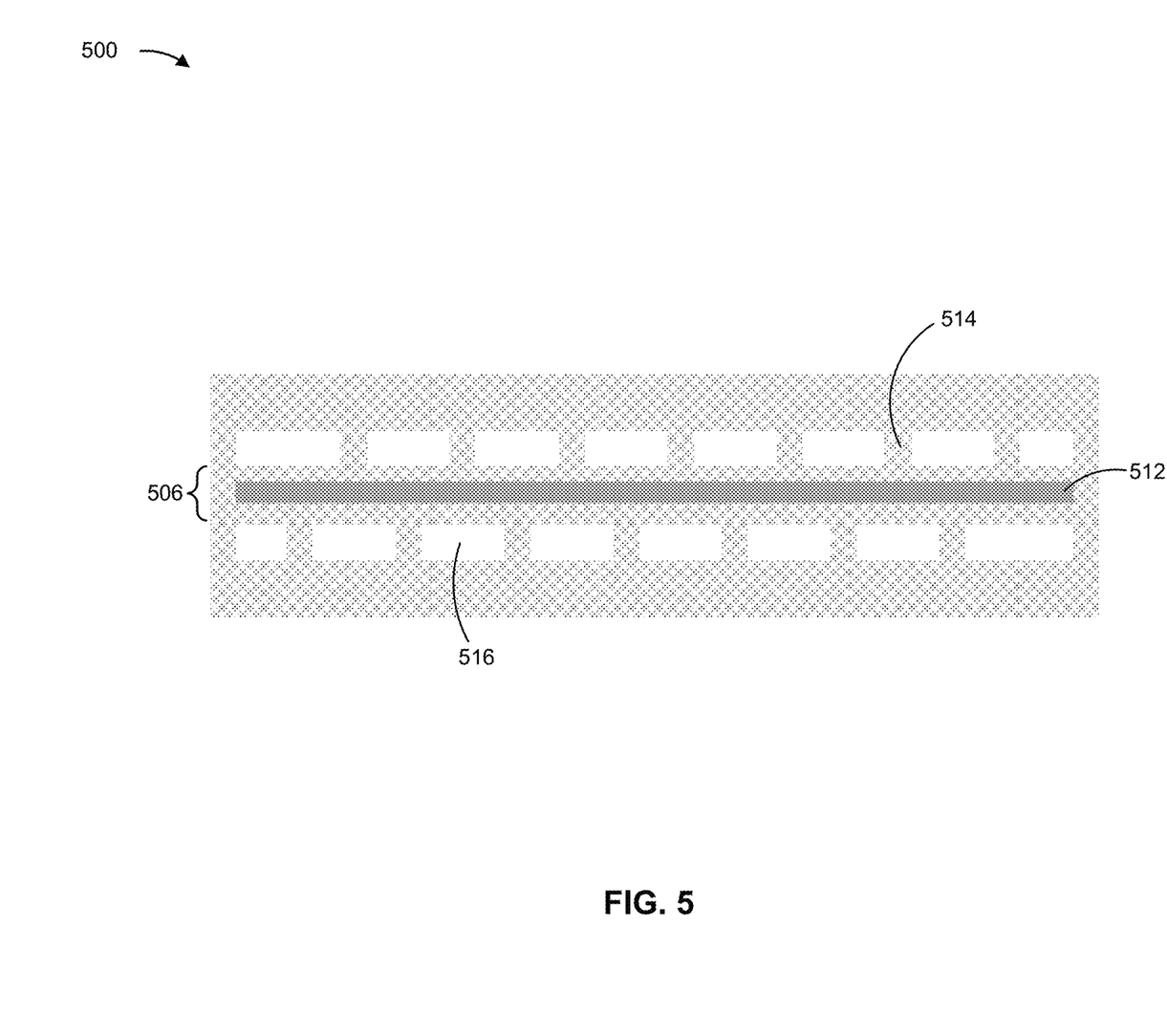
FIG. 5 is an overhead view of an example photonic structure described herein.

FIG. 5 is an overhead view of an example photonic structure 500 described herein. The photonic structure 500 may correspond to, or may be included in, the photonic structure(s) 100, 200, 300, and/or 400. The photonic structure 500 may be thermally uniform, or otherwise thermally controlled. As shown in FIG. 5, the photonic structure 500 may include a suspended region 506 (e.g., including an optical waveguide), a heater element 512, a plurality of bridge elements 514, and a plurality of openings 516, as described above.

As shown in FIG. 5, the bridge elements 514 may be offset on opposite sides of the suspended region 506. That is, the bridge elements 514 may be staggered on opposite sides of the suspended region 506. For example, a first set of the bridge elements 514, extending from a first lateral side of the suspended region 506, and a second set of the bridge elements 514, extending from a second lateral side of the suspended region 506, may be offset (e.g., staggered) relative to each other.

In some implementations, the first set and the second set of the bridge elements 514 may be located along the suspended region 506 according to different spacings (e.g., thereby producing staggering). In some implementations, the first set and the second set of the bridge elements 514 may be located along the suspended region 506 according to the same spacing and according to different offsets from an edge of the suspended region 506. For example, a first bridge element 514 of the first set may be located a first distance from the edge, and a first bridge element 514 of the second set may be located a second distance (e.g., different from the first distance) from the edge.

In some implementations, the heater element 512 may have a uniform width (as shown). In some implementations, the heater element 512 may have a modulated width, as described above in connection with FIGS. 2 and 3. Additionally, or alternatively, a modulation depth for the heater element 512 may change along a length of the heater element 512, as described above in connection with FIG. 4. Additionally, or alternatively, the bridge elements 514 and/or the openings 516 may have non-uniform lengths, as described above in connection with FIG. 4.

As indicated above, FIG. 5 is provided as an example. Other examples may differ from what is described with regard to FIG. 5.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A thermally-controlled mirror structure, comprising:
   an optical waveguide region suspended over a substrate, wherein the optical waveguide region includes a grating for reflecting light;
   a plurality of bridge elements connected to the optical waveguide region and configured to suspend the optical waveguide region over the substrate; and
   at least one heater element disposed on the optical waveguide region,
      wherein the at least one heater element is structured and arranged relative to the plurality of bridge elements to compensate for heat dissipation along the plurality of bridge elements and to control a temperature profile along the grating,
      wherein the at least one heater element includes at least one concave section, and
      wherein the at least one heater element is structured and arranged relative to the plurality of bridge elements such that the at least one concave section is in alignment with a bridge element of the plurality of bridge elements.

2. The thermally-controlled mirror structure of claim 1, wherein the at least one heater element comprises a resistive heater.

3. The thermally-controlled mirror structure of claim 1, wherein the temperature profile is uniform.

4. The thermally-controlled mirror structure of claim 1, wherein, to compensate for a self-heating effect caused by a light source on the grating, the plurality of bridge elements and the at least one heater element are structured and arranged relative to one another such that:
   lengths of the plurality of bridge elements decrease in a direction of light propagation from the light source, and
   the at least one concave section includes a plurality of concave sections that increase in depth in the direction of light propagation from the light source.

5. The thermally-controlled mirror structure of claim 1, wherein a first section of the thermally-controlled mirror structure is closer to a light source than a second section of the thermally-controlled mirror structure, and
   wherein the first section has a first thermal tuning efficiency that is lower than a second thermal tuning efficiency of the second section.

6. The thermally-controlled mirror structure of claim 1, wherein the at least one heater element is further structured and arranged relative to a light source to compensate for a self-heating effect caused by the light source on the grating.

7. The thermally-controlled mirror structure of claim 1, wherein the at least one heater element is positioned above or at a side of a waveguide ridge of the optical waveguide region.

8. The thermally-controlled mirror structure of claim 1, wherein the at least one heater element comprises a first heater element and a second heater element, and
   wherein the first heater element and the second heater element are positioned at opposite sides of a waveguide ridge of the optical waveguide region.

9. A thermally-controlled photonic structure, comprising:
   a suspended region that is suspended over a substrate;
   a plurality of bridge elements connected to the suspended region and configured to suspend the suspended region over the substrate; and
   at least one heater element disposed on the suspended region,
      wherein the at least one heater element is structured and arranged relative to the plurality of bridge elements to compensate for heat dissipation along the plurality of bridge elements and to control a temperature profile along the suspended region,
      wherein the at least one heater element includes at least one concave section, and
      wherein the at least one heater element is structured and arranged relative to the plurality of bridge elements such that the at least one concave section is in alignment with a bridge element of the plurality of bridge elements.

10. The thermally-controlled photonic structure of claim 9, wherein the at least one heater element has rectangular modulation.

11. The thermally-controlled photonic structure of claim 9, wherein the at least one heater element has triangular modulation.

12. The thermally-controlled photonic structure of claim 9, wherein the at least one heater element has sinusoidal modulation.

13. The thermally-controlled photonic structure of claim 9, wherein the at least one concave section has a length that is equal to a length of the bridge element.

14. The thermally-controlled photonic structure of claim 9, wherein lengths of the plurality of bridge elements decrease in a direction of light propagation of the thermally-controlled photonic structure, and
wherein the at least one concave section includes a plurality of concave sections that increase in depth in the direction of light propagation.

15. A tunable laser, comprising:
a thermally-controlled mirror structure, comprising:
an optical waveguide region suspended over a substrate,
wherein the optical waveguide region includes a grating for reflecting light;
a plurality of bridge elements connected to the optical waveguide region and configured to suspend the optical waveguide region over the substrate; and
at least one heater element disposed on the optical waveguide region,
wherein the at least one heater element is structured and arranged relative to the plurality of bridge elements to compensate for heat dissipation along the plurality of bridge elements and to control a temperature profile along the grating,
wherein the at least one heater element includes at least one concave section, and
wherein the at least one heater element is structured and arranged relative to the plurality of bridge elements such that the at least one concave section is in alignment with a bridge element of the plurality of bridge elements.

16. The tunable laser of claim 15, wherein the at least one heater element comprises a first heater element and a second heater element, and
wherein the first heater element and the second heater element are positioned at opposite sides of a waveguide ridge of the optical waveguide region.

17. The tunable laser of claim 15, wherein, to compensate for a self-heating effect caused by a light source on the grating:
lengths of the plurality of bridge elements decrease in a direction of light propagation from the light source, and
the at least one concave section includes a plurality of concave sections that increase in depth in the direction of light propagation from the light source.

18. The thermally-controlled mirror structure of claim 1, wherein the at least one concave section has a length that is equal to a length of the bridge element.

19. The thermally-controlled photonic structure of claim 9, wherein the at least one heater element comprises a resistive heater.

20. The tunable laser of claim 15, wherein the at least one heater element comprises a resistive heater.

* * * * *